United States Patent [19]

Fournel et al.

[11] Patent Number: 5,666,077
[45] Date of Patent: Sep. 9, 1997

[54] METHOD AND APPARATUS FOR DETECTING AN OPERATING VOLTAGE LEVEL IN AN INTEGRATED CIRCUIT

[75] Inventors: Richard Fournel, Le Fontanil; Mathieu Lisart, Aix en Provence, both of France

[73] Assignee: SGS-Thomson Microelectronics S.A., Saint Genis Pouilly, France

[21] Appl. No.: 257,086

[22] Filed: Jun. 9, 1994

[30] Foreign Application Priority Data

Jun. 11, 1993 [FR] France ................................ 93 07095

[51] Int. Cl.⁶ .................................................. H03K 5/22
[52] U.S. Cl. ........................ 327/80; 327/502; 327/580; 257/551
[58] Field of Search ........................ 327/350, 72, 77, 327/78, 79, 58, 61, 80, 530, 583, 584, 580, 502, 74; 257/288, 550, 551, 603; 340/660–663; 324/133, 433; 361/86, 92

[56] References Cited

U.S. PATENT DOCUMENTS

| | | | |
|---|---|---|---|
| 3,264,615 | 8/1966 | Case et al. | 395/490 |
| 3,418,493 | 12/1968 | Uzunoglu et al. | 257/288 |
| 3,444,397 | 5/1969 | Lym | 327/580 |
| 3,444,442 | 5/1969 | Yanagawa | 257/288 |
| 3,544,864 | 12/1970 | Richman | 257/288 |
| 3,648,181 | 3/1972 | Fiore et al. | 327/179 |
| 3,725,795 | 4/1973 | Mesenhimer | 327/74 |
| 3,740,689 | 6/1973 | Yamashita | 257/288 |
| 4,001,614 | 1/1977 | Dahlinger | 327/514 |
| 4,223,238 | 9/1980 | Parkinson et al. | 327/536 |
| 4,258,310 | 3/1981 | Asakawa et al. | 323/281 |
| 4,376,265 | 3/1983 | Kiuchi et al. | 324/426 |
| 4,378,521 | 3/1983 | Thorpe | 323/229 |
| 4,648,076 | 3/1987 | Schrenk | 365/230.01 |
| 4,744,062 | 5/1988 | Nakamura et al. | 365/228 |
| 4,825,018 | 4/1989 | Okada et al. | 323/351 |
| 4,916,494 | 4/1990 | Flohrs et al. | 257/491 |
| 4,931,993 | 6/1990 | Urushima | 365/189.01 |
| 5,027,165 | 6/1991 | Doluca | 257/551 |
| 5,119,336 | 6/1992 | Itoh | 365/195 |
| 5,130,946 | 7/1992 | Watanabe | 365/189.01 |
| 5,151,854 | 9/1992 | Adams et al. | 364/184 |
| 5,226,006 | 7/1993 | Wang et al. | 365/189.01 |

FOREIGN PATENT DOCUMENTS

| | | |
|---|---|---|
| 0065148 A2 | 11/1982 | European Pat. Off. |
| A-3709205 | 9/1988 | Germany. |
| WO-A-8903081 | 4/1989 | WIPO. |

Primary Examiner—Timothy P. Callahan
Assistant Examiner—Kenneth B. Wells
Attorney, Agent, or Firm—David M. Driscoll; James H. Morris

[57] ABSTRACT

A Zener diode is used to simplify a circuit for detecting the level of an operating voltage with respect to a specified range of use. The semiconductor junction of this Zener diode is biased alternately by one voltage or another. Under these conditions, the avalanche voltage of this Zener diode changes. The operating voltage to be monitored is connected to the cathode of this Zener diode. If the monitored operating voltage is higher than the avalanche voltage of this Zener diode, the diode alternately conducts. If the operating voltage is outside this range, this diode is either permanently on or permanently off. The variations that result therefrom are detected to report whether the operating voltage is correct.

26 Claims, 3 Drawing Sheets

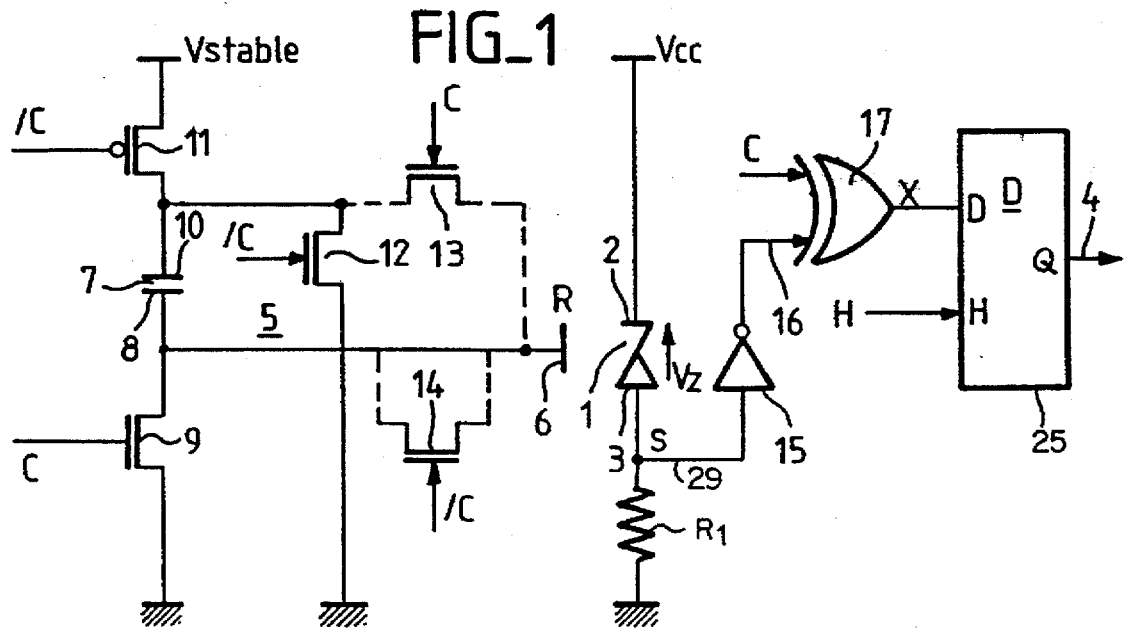
FIG_1
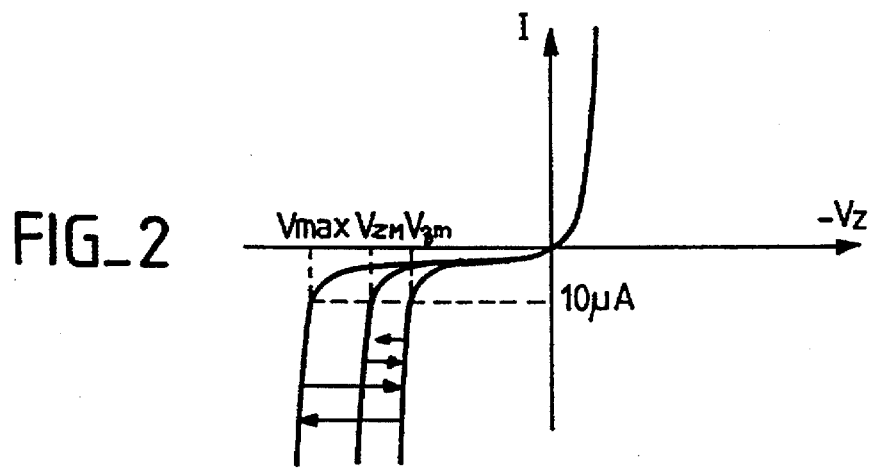
FIG_2
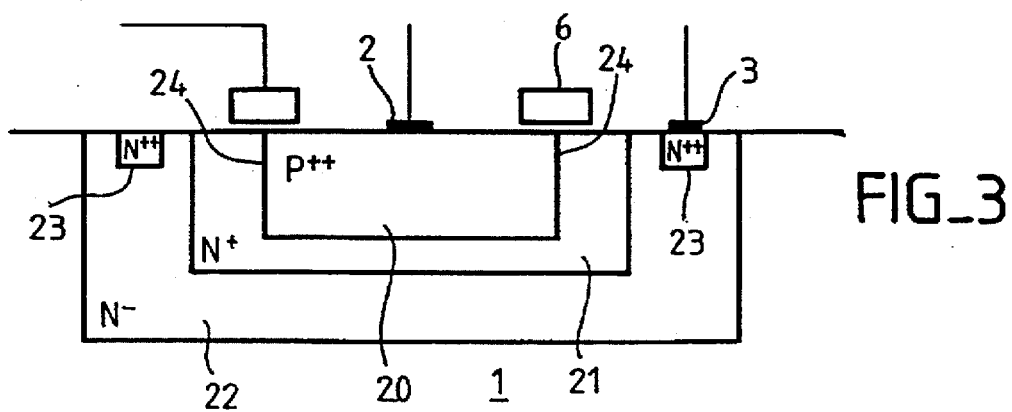
FIG_3

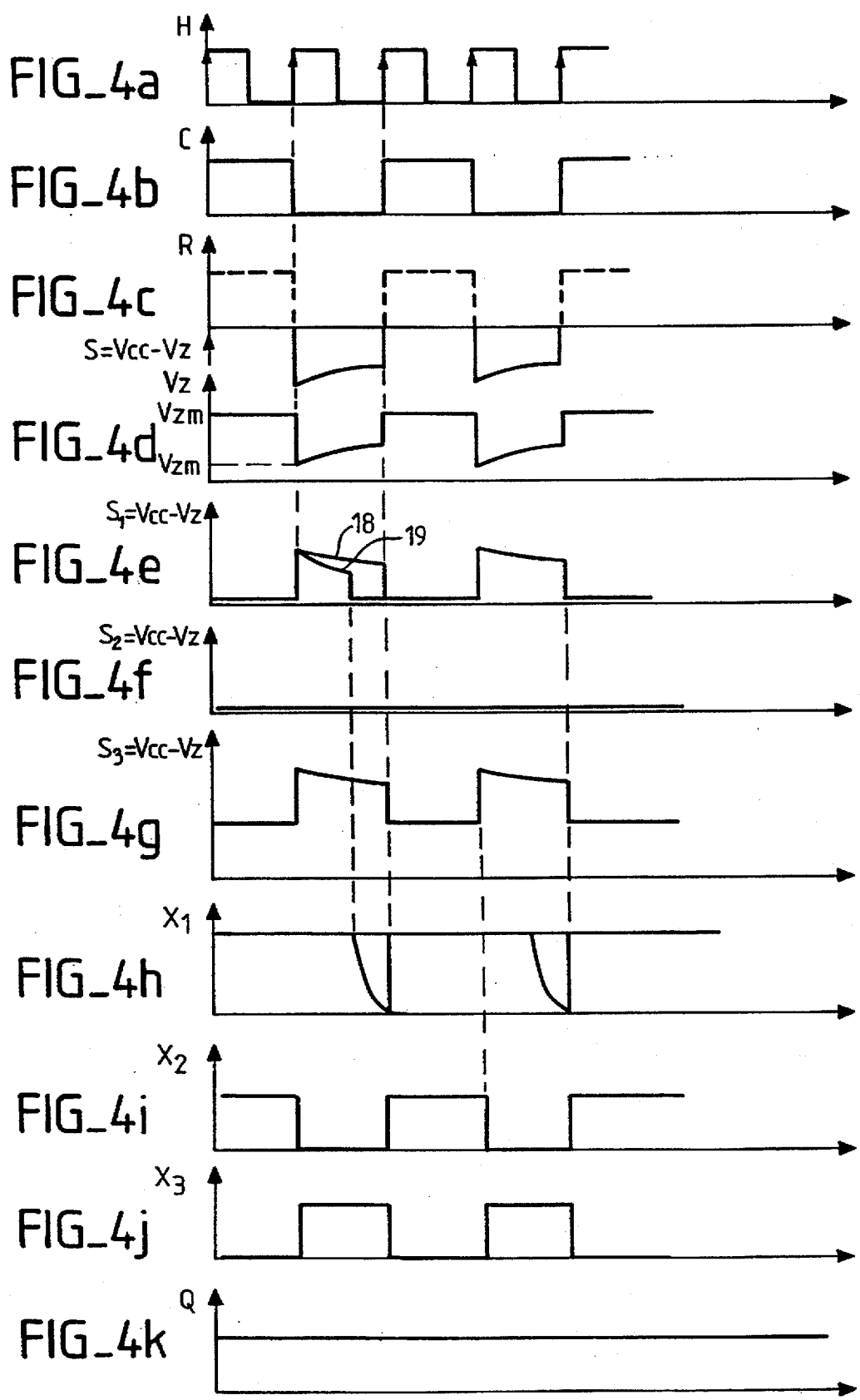

FIG_5
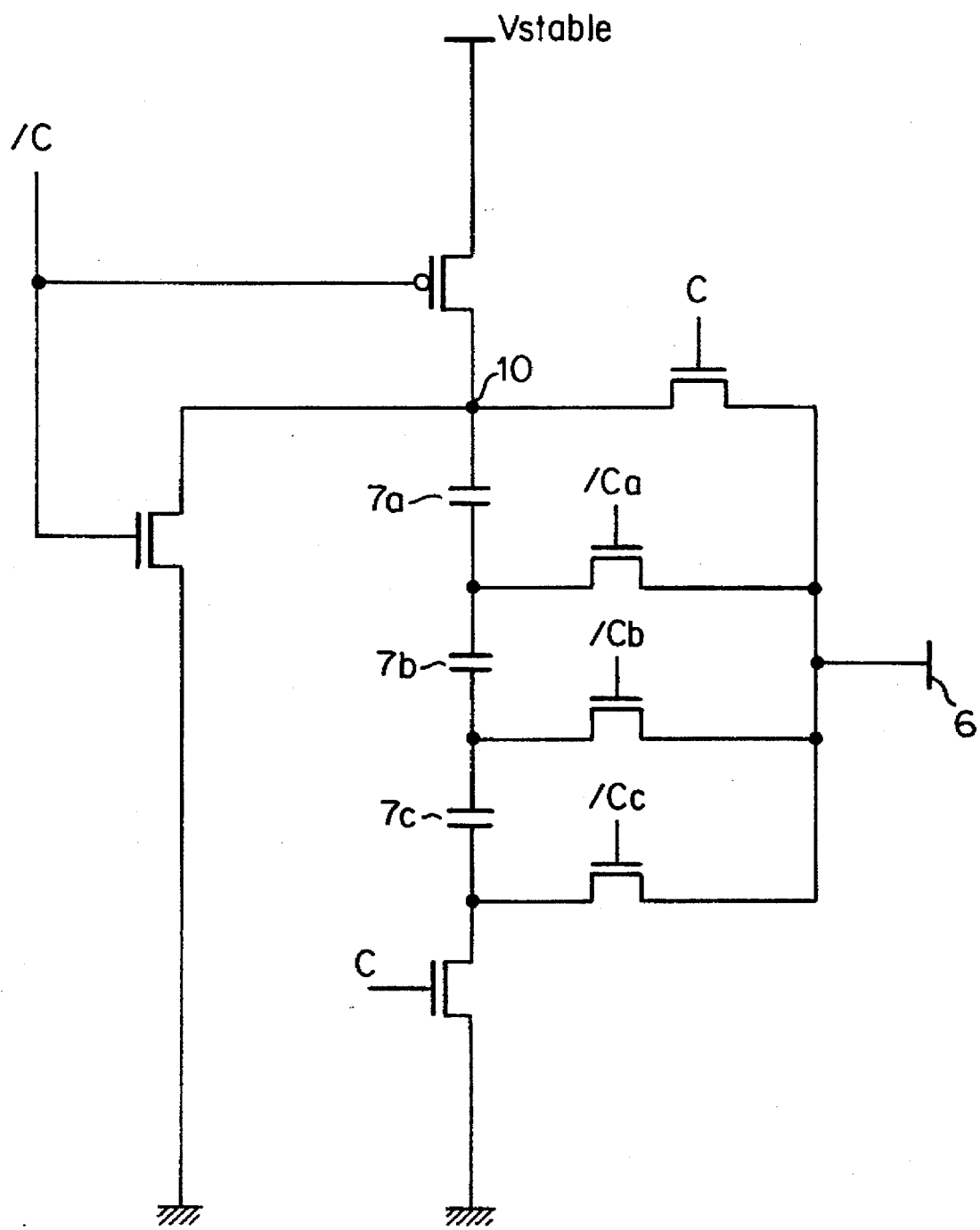

1

METHOD AND APPARATUS FOR DETECTING AN OPERATING VOLTAGE LEVEL IN AN INTEGRATED CIRCUIT

BACKGROUND OF THE INVENTION

1. Field of the Invention

An object of the present invention is to provide an integrated circuit having a circuit for detecting an operating voltage, the circuit being useful in the field of semiconductor circuits, notably CMOS type semiconductor circuits.

2. Discussion of the Related Art

There are known circuits for detecting the crossing, by a voltage to be monitored, of a reference voltage. These circuits typically have differential amplifiers for receiving a reference voltage and an operating voltage. Such circuits require a precise external reference voltage. These circuits have an advantage in that the reference voltage may have any value since it is fixed externally. One of the problems to be resolved, however, is in producing a reference voltage whose value can be set as desired but which, once chosen, is the same for all the fabricated circuits.

In the manufacture of integrated circuits, variations are found in the characteristics of the circuits because of the method of manufacturing the circuit, and because of the conditions of use. The manufacturing variations reflect variations undergone by the circuit during the different stages of its manufacture. Many parameters come into play in a manufacturing process, including the duration and density of ion implantations, and the nature and quality of masking operations. The manufactured product is highly sensitive to these manufacturing parameters and thus, there is a great variation in the characteristics obtained. During use, an integrated circuit is subjected to stresses, notably relating to temperature and supply voltage, which may have harmful repercussions on the chosen threshold voltages.

Another device for detecting of threshold voltages has been proposed. It uses the avalanche voltage of a diode, preferably a Zener diode. The detected threshold voltage of a Zener diode manufactured according to a given method will vary as a function of the temperature of use of the circuit only from, for example, 5.35 to 5.48 volts. This low variation is a valuable feature. The reference voltage thus obtained has a drawback, however, in that, for a given method, it cannot be set as desired since it is determined by the given manufacturing method.

This situation shows that known circuits for delivering reference voltages which are used to compare an operating voltage with a reference voltage are either complicated, stable, constant, and adjustable; or simple, stable, and constant, but not adjustable.

SUMMARY OF THE INVENTION

These drawbacks are overcome by a simple device whose principle of detection is that of the comparison of an operating voltage with a reference voltage which is known through an avalanche phenomenon in a semiconductor junction and which, furthermore, is adjustable. The invention is preferably used to ascertain that the range of operating voltage of an integrated circuit, conforms to a range resulting from a specification and the signal for the detection of the level of the operating voltage with respect to this reference voltage will be used to permit or disallow the working of the integrated circuit.

According to the present invention, an integrated circuit includes a detecting circuit for detecting the level of an operating voltage. The detecting circuit has a detector diode with a cathode for connection to the operating voltage, and an anode for connection to a load constituting an output of the detection circuit. The avalanche voltage of the diode is used as a reference voltage. The integrated circuit also has a bias circuit, connected to an electrode to bias a semiconductor function of the diode with at least one bias value.

BRIEF DESCRIPTION OF THE DRAWINGS

The invention will be understood more clearly from the following detailed description and from the figures that accompany it. These figures are given solely by way of an indication and in no way restrict the scope of the invention. Of these figures:

FIG. 1 is a schematic of a detection integrated circuit according to the invention;

FIG. 2 is a graph of a characteristic curve of a semiconductor junction, especially a Zener type junction;

FIG. 3 is a cross-sectional view of a semiconductor substrate in which a detector diode according to the invention is made;

FIGS. 4a–4k are timing diagrams of signals according to the present invention; and FIG. 5 shows how the capacitor 7 of FIG. 1 is implemented in one embodiment of the present invention.

DETAILED DESCRIPTION

FIG. 1 shows an integrated circuit having a circuit for detecting the level of an operating voltage. The operating voltage to be monitored is, for example, a supply voltage Vcc of an integrated circuit to which the circuit of FIG. 1 is connected. In practice, the detection circuit of FIG. 1 is made on the same semiconductor substrate as the integrated circuit to be monitored.

The detection circuit has a detector diode 1, preferably a Zener diode. Diode 1 has a cathode 2 connected directly to the operating voltage Vcc, and an anode 29 coupled to an output terminal 4 of the detection circuit. According to an embodiment of the present invention, the detection circuit includes a circuit 5 for delivering a cyclical signal, which is preferably an alternating signal. Circuit 5 is connected to an electrode 6 for biasing the junction of diode 1. In general, the signal may be constant and its value is used for threshold-setting. Under the influence of this cyclical, alternating voltage, the avalanche voltage $V_Z$ of diode 1 is modified. Consequently, a voltage level available at an output 29 depends on the level of the operating voltage Vcc with respect to a high value $V_{ZM}$ of the avalanche voltage, and to a low value $V_{zm}$ of the avalanche voltage.

Preferably, anode 3 is connected to ground through a resistor 7 which may he formed in different ways in the integrated circuit, such as in the form of an N-type transistor mounted as a resistor with its control gate connected to its drain. Thus, diode 1 is reverse biased.

If the operating voltage Vcc is greater than each of the two thresholds, $V_{ZM}$ and $V_{zm}$, diode 1 is permanently in a state of avalanche and a signal S, at anode 3 of the diode 1, is at a high level. Current flowing into resistor 7 raises the voltage at anode 3. This level is permanently high, however the alternating signal applied to the electrode 6 is altered. Conversely, if the operating voltage Vcc is lower than each of the two avalanche voltages, the diode is permanently off. In this case, the signal S is constant and equal to zero.

If the operating voltage is between thresholds $V_{ZM}$ and $V_{zm}$, the diode will be in avalanche mode during one half-wave, and off during the next half-wave. Consequently, signal S available at anode 3 will also be an alternating signal. This characteristic indicates that the operating voltage conforms to the normal use of the integrated circuit.

Rather than having a bias with only two states applied to diode 1, it is possible to have a bias with several states which are also applied sequentially and/or alternately so that, with the state of the applied bias being known, a logic circuit can make it possible to determine that range of operation, among several permitted ranges of operation, to which the monitored operating voltage belongs. In other words, the principle consists in ascertaining that, while the avalanche voltage of the diode goes from one value to another, the signal available at anode 3 changes or does not change. If it changes, the operating voltage is located in the concerned range. If it does not change, the operating voltage is outside the concerned range. It is thus possible to provide for the application, periodically, of a succession of calibrated bias voltages to the electrode 6 in order to detect the calibrated values between which, or outside of which, the operating voltage Vcc is located.

To produce the bias voltages applied to electrode 6, circuit 5 preferably has a capacitor 7 connected at a first terminal 8 to electrode 6 and also through a transistor 9 to ground. In the example shown, transistor 9 is an N-type transistor whose drain is connected to terminal 8 of capacitor 7 and whose source is connected to ground. Another terminal 10 of capacitor 7 is connected through a P-type transistor 11 to a positive voltage which is preferably stabilized. Since it is desired to monitor the operating voltage Vcc, which is generally the supply voltage of the integrated circuit, it may seem questionable to connect the source of transistor 11 to the supply voltage itself. However, this is also possible: the defining tolerances of the avalanche voltages $V_{ZM}$ and $V_{zm}$ may then be slightly affected. The drain of transistor 11, connected to terminal 10 of capacitor 7, is itself connected to the drain of an N-type transistor 12. The source of transistor 12 is connected to ground. Transistors 9 and 11 respectively receive control signals C and /C that are complementary to one another, preferably alternating square-wave signals as shown in FIG. 4(b). Transistor 12 also receives signal /C that is complementary to signal C.

Under these conditions, circuit 5 operates as follows. When signal C is at a high level, transistors 11 and 9 are on, and transistor 12 is off. Thus, terminal 10 of capacitor 7 is charged positively to a voltage equal to the stabilized voltage minus $V_z$. Terminal 8 is grounded. During the next half-wave period (the half-waves are preferably non-overlapping), terminal 10 is connected to ground through transistor 12 while terminal 8 is connected to electrode 6. Thus, electrode 6 receives a voltage that is negative with respect to ground, with a value substantially equal to the absolute value of the stabilized bias voltage. Subjected to the influence of this negative voltage, the profile of the junction is modified. In this case, avalanche voltage $V_z$ varies. This variation is shown schematically in FIG. 2 which shows the characteristic curve of response of a Zener diode in terms of current and voltage. At about 10 microamperes, this value of avalanche voltage varies, for example, between 5.5 volts and 3 volts.

In FIG. 1, an optional N-type transistor 13 (shown in dashed lines) has a drain connected to the source of transistor 11 and a source connected to electrode 6. Similarly, a transistor 14 (also in dashed lines) is interposed in the connection between terminal 8 of capacitor 7 and electrode 6. The drain and the source of transistor 14 are connected respectively to the terminal 8 and to electrode 6.

In one example, transistor 13 receives signal C while the transistor 14 receives signal /C at its control gate. An assembly such as this means that the electrode 6, instead of being subjected to a voltage oscillating between ground and the negative stabilized voltage, is subjected to plus or minus the stabilized voltage value.

Consequently, the avalanche voltage of diode 1 is shifted towards higher values. Diode 1 then oscillates between a value Vmax and Vzm. By mounting transistors 9 and 11 to transistor 14, it is possible, with appropriate commands to these transistors, to dictate a bias that oscillates between any of the three possible bias values: V stable, 0 volt, minus V stable. It is enough, for example, by commanding transistors 13 and 14 respectively by means of signals /C and C, to modify the two alternating biases.

To have other bias values, it is naturally possible to think of having, instead of capacitor 7, a cascade of series-connected capacitors 7a, 7b, 7c and of connecting midpoints between two consecutive capacitors, optionally, to electrode 6 by the appropriate control of a connection transistor. This electrode can then be subjected to a scale of bias voltages. According to the invention, this scale of bias voltages will be reapplied cyclically and, correspondingly, signal S that results therefrom will be used in synchronization.

An explanation shall now be given of the way in which signal S is processed, this signal S being theoretically constant when the operating voltage has a value outside the range being monitored or of the alternating type when this operating voltage has a value within the range being monitored. To this end, in one example, anode 3 of diode 1 is connected to an inverter 15 whose detection threshold is low; for example, Vcc/5. In FIG. 2, the characteristic curve shown is that of a Zener type diode so that its slope is as steep as possible when, in the negative state, the voltage applied in reverse to the diode goes beyond the avalanche voltage. In this case, whatever is the current that flows into resistor 21, the voltage at anode 3 is taken to Vcc minus the substantially constant avalanche voltage value. The value of the detection threshold of the inverter 15 then just needs to be below this voltage. Random factors related to manufacturing and to the conditions of use, both regarding temperature and the supply voltage of this inverter, therefore, have negligible effects. The output 16 of inverter 15 is applied to a first input of a logic gate 17 which, in this case, is of the exclusive-OR type. Gate 17 receives signal C at its other input.

FIG. 4c shows the bias value applied to electrode 6. The signal R thus applied has negative square waves and, optionally, positive square waves. In the negative square waves, a slight decrease in absolute value of the voltage is observed. This is due to leakage in capacitor 7. In the immediate term, this effect is overlooked. The way in which this effect can be overcome shall be explained hereinafter.

FIG. 4d shows a corresponding timing diagram of the avalanche voltage of the diode 1. When signal C is at the top level, electrode 6 is grounded constantly; and the avalanche voltage is equal to $V_{ZM}$. By contrast, when the negative voltage of terminal 10 is taken to the electrode 6, the avalanche voltage is lower: it is equal to $V_{zm}$. The avalanche voltage $V_z$ further changes in accordance with the exponential decrease due to discharging of capacitor 7.

FIG. 4e shows the shape of a signal S1 at anode 3 when the operating voltage Vcc is a voltage between the two avalanche voltages of diode 1. When signal C is at the high level, signal S1 is equal to zero. When signal C is at the low level, signal S1 is at the high level. In FIG. 4e, lines 18 and 19 show effects that differ depending on whether the decrease caused by the discharging of the capacitor 7 is low and negligible or substantial, respectively. When it is low, the signal S1 remains at the high level until the end of the half-wave. When it is high, the signal S1 falls back to the low level before the end of the half-wave.

FIG. 4f shows the value of a signal S2, i.e., signal S, when Vcc is below the low threshold voltage, $V_{zm}$. In this case, diode 1 is off, and signal S2 is at zero all the time.

FIG. 4g shows what happens for a signal S3 when Vcc is above the high threshold $V_{ZM}$. In this case, diode 1 is in avalanche mode in every case. Resistor R1 is permanently charged by a current which is slightly higher when signal C is in the low state. In any case, signal S3 is permanently higher than the threshold voltage for triggering of inverter 15. The result of this situation is that output 16 of inverter 15 is constant when the operating voltage is external to the monitored range, and alternating when it is within this range.

With the exclusive-OR gate 17 receiving signal C, this shape is inverted and alternating signal S is converted into constant signal X, or constant signal S is converted into an alternating signal X, respectively. Thus, a signal X1 corresponding to signal S1 is constant, at least if the discharging of capacitor 7 is low. On the contrary, signals X2 and X3, which correspond respectively to outputs S2 and S3, are alternating signals. The alternating character of these outputs is used to judge the value of the operating voltage.

If the operating voltage is below the low threshold (S2, X2), signal X is in phase with the signal C. If, on the contrary, it is above the high avalanche voltage, signal X is in phase opposition with signal C. Consequently, the logic circuit 17 enables the value of the operating voltage to be properly assessed.

To prevent the effects of the discharge of capacitor 7, a D type flip-flop 18 is interposed at the output of the circuit of the invention. This flip-flop has two inputs, D and H, and one output, Q. The D type flip-flop transmits and keeps at its output Q a value of a signal introduced at D at the point in time when the input H receives an edge, namely a leading edge, of a binary signal.

To this end, a clock signal H is used, having leading edges at the instant corresponding to the leading and trailing transitions of signal C. In practice, it is possible to produce signal C with a bistable circuit receiving a clock signal at its control input.

Under these conditions, when the leading edge of signal H occurs, signal X1 is still in the high state. It drops to a low state only at the end of the pulse. Under these conditions, signal Q (FIG. 4k) is kept in a high state when the operating voltage is in the range $V_{ZM}$-$V_{zm}$. Naturally, signal Q evolves alternately in the opposite case.

Another way to overcome the problem of discharging the capacitor 7 is to increase the frequency of clock signal H and, correspondingly, that of control signal C. Operation in this mode is limited by the dynamic operation of the Zener diode due to the accumulation of charges in the zone of diffusion of the junction of this diode. In practice, a one-kilohertz operation is quite well tolerated and gives good results.

FIG. 3 shows a preferred exemplary embodiment of a Zener type diode that can be used as a diode 1. This diode has a first P++ type, a shallow, circular zone 20 implanted with boron impurities with a density of the order of $10^{20}$. Zone 20 is implanted in an N+ type zone 21 that surrounds it and is used to make so-called "Capa implant" type capacitors. Zone 21 is implanted normally before the use of the first-level type of polysilicon. The density of phosphorus or arsenic impurities implanted is of the order of $10^{18}$. Zone 21 itself is implanted in an N-type zone 22 whose density of implantation, with same types of impurities, is in the range of about $5 \times 10^{16}$. Zones 20, 21, and 22 preferably constitute a concentric structure (seen from above). In the ring of zone 22, there is also made an N++ doped ring 23 with a doping of the order of $10^{20}$ impurities of arsenic. The diode of FIG. 3 is a Zener diode because zones 20 and 21, forming a junction with each other, are highly doped. Above the junction, at a boundary 24 between zones 20 and 21, polysilicon electrode 6 is made.

Electrode 6 is separated from junction zone 24 by a gate oxide (not shown) that can be made at the same time as the gate oxides of transistors 11 to 14. The electrode 6 also has a circular shape (FIG. 3 shows a diameter section). Zone 20 acts as a cathode while ring 23 acts as an anode. Each of these zones 20 and 23 is connected by means of a metallization, for example an aluminium metallization, to the concerned pad of the circuit.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is byway of example only and is not intended as limiting. The invention is limited only as defined in the following claims and the equivalents thereto.

What is claimed is:

1. A detection circuit for detecting a voltage level of an operating voltage in an integrated circuit, the detection circuit comprising;

a diode having
    a semiconductor junction,
    a control terminal, electrically coupled to the semiconductor junction, that receives a bias signal to control an avalanche voltage of the diode,
    a cathode region of a first conductivity type, coupled to the operating voltage of the integrated circuit,
    an anode region of a second conductivity type, adjacent the cathode region such that the semiconductor junction is formed between the anode region and the cathode region, and
    an output, coupled to the anode region, having a voltage level that is a function of the operating voltage level and the avalanche voltage of the diode; and
  a biasing circuit, coupled to the control terminal, that provides the diode with the bias signal having a bias voltage with at least one bias value.

2. The detection circuit of claim 1, wherein the biasing circuit includes a circuit that provides a cyclical signal as the bias signal to bias the diode at different bias values to vary the avalanche voltage of the diode.

3. The detection circuit of claim 2, wherein the biasing circuit includes:

a first transistor having a first terminal coupled to a first reference voltage of the integrated circuit and a second terminal;
  a capacitor having a first terminal connected to the control terminal of the diode and a second terminal, the first terminal being also connected to the second terminal of the first transistor;
  a second transistor having a first terminal connected to the second terminal of the capacitor, and a second terminal coupled to a second reference voltage; and wherein the circuitry for providing a cyclical signal provides an alternating signal.

4. The detection circuit of claim 3, wherein the diode is a Zener diode.

5. A detection circuit for detecting a voltage level of an operating voltage in an integrated circuit, the detection circuit comprising:
a diode having
a semiconductor junction,
a control terminal, electrically coupled to the semiconductor junction, that receives a bias signal to control an avalanche voltage of the diode,
a cathode region of a first conductivity type, coupled to the operating voltage of the integrated circuit,
an anode region of a second conductivity type, adjacent the cathode region such that the semiconductor junction is formed between the anode region and the cathode region, and
an output, coupled to the anode region, having a voltage level that is a function of the operating voltage level and the avalanche voltage of the diode; and
a biasing circuit, coupled to the control terminal, that provides the diode with the bias signal having a bias voltage with at least one bias value wherein the biasing circuit includes a logic circuit, and a number of capacitors cascaded in series and coupled to the logic circuit, coupled to the control terminal of the diode, coupled to a first reference voltage of the integrated circuit, and coupled to a second reference voltage of the integrated circuit.

6. The detection circuit of claim 2, further comprising a synchronization circuit having an input that receives the cyclical signal and having an output that provides a synchronization signal synchronized with the cyclical signal, and an output circuit having a first input coupled to the anode region of the diode, a second input coupled to the output of the synchronization circuit and an output that provides a logical combination of signals at the first and second inputs.

7. The detection circuit according to claim 6, wherein the logic gate is an XOR gate.

8. A detection circuit for detecting a voltage level of an operating voltage in an integrated circuit, the detection circuit comprising:
a diode having
a semiconductor junction,
a control terminal, electrically coupled to the semiconductor junction, that receives a bias signal to control an avalanche voltage of the diode,
a cathode region of a first conductivity type, coupled to the operating voltage of the integrated circuit,
an anode region of a second conductivity type, adjacent the cathode region such that the semiconductor junction is formed between the anode region and the cathode region, and
an output, coupled to the anode region, having a voltage level that is a function of the operating voltage level and the avalanche voltage of the diode;
a biasing circuit, coupled to the control terminal, that provides the diode with the bias signal having a bias voltage with at least one bias value; and
an output circuit that detects an output level of the detection circuit at a start of each half-wave of an alternating cyclical signal.

9. The detection circuit according to claim 8, wherein the output circuit includes a D type flip-flop triggered at each half-wave of the alternating cyclical signal.

10. The detection circuit of claim 5, wherein the diode is a Zener diode.

11. A method for detecting a level of an operating voltage in an integrated circuit, the method comprising the steps of:
providing a detector diode having
a semiconductor junction,
a control terminal electrically coupled to the semiconductor junction to control an avalanche voltage of the diode,
a cathode region of a first conductivity type, and
an anode region of a second conductivity type, adjacent the cathode region such that the semiconductor junction is formed between the anode region and the cathode region; and
establishing the avalanche voltage of the diode by biasing the semiconductor junction of the detector diode with at least one bias value;
electrically coupling the cathode region of the diode to the operating voltage of the integrated circuit; and
detecting the voltage level of the operating voltage and providing a signal that is a function of the operating voltage and the avalanche voltage at the anode region of the diode.

12. The method of claim 14, wherein the biasing step includes a step of providing a cyclical signal to the control terminal to bias the diode at different bias values.

13. The method of claim 12, wherein the biasing step includes a step of providing an alternating cyclical signal to the control terminal of the detector diode to vary the avalanche voltage of the detector diode.

14. A method for detecting a level of an operating voltage in an integrated circuit, the method comprising the steps of:
providing a detector diode having
a semiconductor junction,
a control terminal electrically coupled to the semiconductor junction to control an avalanche voltage of the diode,
a cathode region of a first conductivity type, and
an anode region of a second conductivity type, adjacent the cathode region such that the semiconductor junction is formed between the anode region and the cathode region;
establishing the avalanche voltage of the diode by biasing the semiconductor junction of the detector diode with at least one bias value;
electrically coupling the cathode region of the diode to the operating voltage of the integrated circuit; and
detecting the voltage level of the operating voltage and providing a signal that is a function of the operating voltage and the avalanche voltage at the anode region of the diode;
wherein the biasing step comprises the steps of:
providing a circuit including a logic circuit;
coupling a number of capacitors to the logic circuit, to the control terminal to bias the diode, to a first reference voltage terminal of the integrated circuit, and to a second reference voltage terminal of the integrated circuit.

15. The method of claim 12, further comprising steps of:
coupling the anode region of the diode to an output circuit that detects a voltage level at the anode region; and
providing a circuit for delivering a synchronization signal synchronized with the cyclical signal to the output circuit.

16. The method of claim 13, further comprising a step of coupling an output circuit to the anode region of the detector diode to detect an output level of the detector diode at a start of each half-wave of the alternating cyclical signal.

17. The method of claim 16, further comprising the step of providing a synchronization signal to the output circuit synchronized with the half-wave of the alternating cyclical signal.

18. A circuit for detecting a level of an operating voltage of an integrated circuit, the circuit comprising:

a detecting circuit having a device that exhibits an avalanche breakdown when a voltage across the device exceeds a reference voltage level of the device, having a first terminal coupled to the operating voltage of the integrated circuit and an output terminal for providing an output signal of the detecting circuit, the output signal having a voltage level that is a function of the reference voltage level and the operating voltage of the integrated circuit; and a biasing circuit, electrically coupled to the device, that provides an alternating cyclical voltage level to adjust the reference voltage level of the device such that the reference voltage level is alternating and cyclical.

19. A circuit for detecting a level of an operating voltage of an integrated circuit, the circuit comprising:

a detecting circuit having a device that exhibits an avalanche breakdown when a voltage across the device exceeds a reference voltage level of the device, the detecting circuit having a first terminal coupled to the operating voltage of the integrated circuit and an output terminal for providing an output signal of the detecting circuit, the output signal having a voltage level that is a function of the reference voltage level and the operating voltage of the integrated circuit;

a biasing circuit, electrically coupled to the device, that provides an alternating cyclical voltage level to adjust the reference voltage level of the device such that the reference voltage level is alternating and cyclical;

an output circuit coupled to the output terminal; and means, coupled to the output circuit, for providing a synchronization signal synchronized with the alternating cyclical signal.

20. The circuit of claim 19, wherein the detecting circuit includes a Zener diode.

21. The circuit of claim 20, wherein the device exhibiting an avalanche breakdown includes:

a semiconductor substrate;

a first region of a first conductivity type in the surface of the substrate;

a second region of a second conductivity type adjacent the first region at a junction;

a first electrode, coupled to the first region, for connection to the first terminal of the detecting circuit;

a second electrode coupled to the second region; and a third electrode electrically coupled to the junction and coupled to the biasing circuit to receive the cyclical signal and alter an avalanche voltage of the junction.

22. The circuit of claim 21, wherein the providing means provides an alternating signal.

23. The circuit of claim 21, wherein the second region includes first and second circular regions, the second circular region surrounding the first circular region, the second circular region having a greater density of impurities of the second conductivity type.

24. The circuit of claim 23, wherein the first region is of the P++ type, the first circular region is of the N+ type, and the second circular region is of the N++ type.

25. The circuit of claim 21, further comprising an oxide intermediate the third electrode and the junction.

26. The circuit of claim 21, wherein the first region is a circular region embedded within the second circular region and is of a P++ type.

* * * * *